(12) United States Patent
Shen et al.

(10) Patent No.: US 6,343,367 B1
(45) Date of Patent: Jan. 29, 2002

(54) ERROR CORRECTION SYSTEM FOR FIVE OR MORE ERRORS

(75) Inventors: Ba-Zhong Shen; Lih-Jyh Weng, both of Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/277,785

(22) Filed: Mar. 29, 1999

(51) Int. Cl.$^7$ .............................................. H03M 13/00
(52) U.S. Cl. ...................................................... 714/782
(58) Field of Search ........................ 708/492; 714/781, 714/782, 784, 785

(56) References Cited

U.S. PATENT DOCUMENTS

| | | | | |
|---|---|---|---|---|
| 4,866,716 A | * | 9/1989 | Weng | 714/782 |
| 5,001,715 A | * | 3/1991 | Weng | 714/782 |
| 5,710,782 A | * | 1/1998 | Weng | 714/785 |
| 5,761,102 A | * | 6/1998 | Weng | 708/492 |

* cited by examiner

Primary Examiner—Phung M. Chung
Assistant Examiner—Shelly A Chase
(74) Attorney, Agent, or Firm—Cesari and McKenna, LLP

(57) ABSTRACT

An error correcting system for correcting "t" errors over $GF(2^m)$, where t is even and preferably greater than or equal to six, transforms the t-degree error locator polynomial c(x) into a polynomial t(x) in which $a_{t-1} \approx 0$, where $a_i$ is the coefficient of the $x^i$ term of the error locator polynomial and $Tr(a_{t-1})=1$, where $Tr(a_i)$ is the trace of $a_i$. The polynomial t(x) is factored into two factors, namely, one factor that is the greatest common divisor of t(x) and $$S(x) = \sum_{i=0}^{m-1} x^{2^i},$$

and a second factor that is the greatest common divisor of t(x) and S(x)+1. The system determines the greatest common divisor of the polynomial and S(x) in two steps, first iteratively determining a residue $R(x) \equiv S(x) \bmod t(x)$, and then calculating the greatest common divisor of t(x) and the lower-degree R(x). The system produces two factors of t(x), namely, g(x)=gcd(t(x), R(x)) and $$h(x) = \frac{t(x)}{g(x)},$$

and then determines the roots of the factors and transforms these roots into the roots of the error locator polynomial or, as necessary, continues factoring into factors of lower degree before determining the roots. When "t" is odd, the system represents the roots $r_i$ of the error locator polynomial as a linear combination of $r_{i,k}\beta_k$ for k=0,1 ... m−1, where $r_{i,k} \in GF(2)$ and $\beta_k$ is an element of a dual basis for $GF(2^m)$ over GF(2), and $Tr(\alpha^j\beta_k)$ equals one when j=k and equals zero when j≠k. The roots $r_i$ are then $$r_i = r_{i,0}\beta_0 + r_{i,1}\beta_1 + \ldots + r_{i,m-1}\beta_{m-1}$$

and $$Tr(\alpha^j r_i) = \sum_{k=0}^{m-1} r_{i,k} Tr(\alpha^j \beta_k) = r_{i,j}$$

The system next determines the greatest common divisor of the polynomial and $S(\alpha^j x)$ by iteratively determining $R_j(x) \equiv S(\alpha^j x) \bmod c(x)$, and then determining the greatest common divisor of c(x) and $R_j(x)$. The system next determines two factors of c(x) as $g(x)=gcd(c(x), R_j(x))$ and $$h(x) = \frac{t(x)}{g(x)}$$

and finds the roots of the two factors.

8 Claims, 7 Drawing Sheets

$i = 4, 5, \ldots, m-1$ (i.e. $m-3$ clock cycle)

ERROR CORRECTION SYSTEM FOR FIVE OR MORE ERRORS

FIELD OF THE INVENTION

This invention relates generally to data processing systems and, more particularly, to a system for decoding and correcting errors in data using an error correction code.

BACKGROUND OF THE INVENTION

Data stored on magnetic media, such as a magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is thus required to correct greater numbers of errors, which include greater numbers of burst errors. The speed with which the system corrects the errors is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes,* 2nd Ed. MIT Press, 1972].

To correct multiple errors in strings of data symbols, the system typically uses an ECC that efficiently and effectively utilizes the various mathematical properties of sets of symbols known as Galois fields. Galois fields are represented "GF ($P^M$)", where "P" is a prime number and "M" can be thought of as the number of digits, base "P", in each element or symbol in the field. P usually has the value 2 in digital computer and disk drive applications and, therefore, M is the number of bits in each symbol. The ECC's commonly used with the Galois Fields are Reed Solomon codes or BCH codes.

There are essentially four major steps in decoding a corrupted code word of a high rate Reed-Solomon code or a BCH code. The system first determines error syndromes that are based on the results of a manipulation of the ECC symbols. Next, using the error syndromes, the system determines an error locator polynomial, which is a polynomial that has the same degree as the number of errors. The system then finds the roots of the error locator polynomial and from each root determines the location of an associated error in the code word. Finally, the system finds error values for the error locations.

The steps of determining the syndromes and finding the error locations are the most time consuming in the error correction process. This invention relates to the step of finding the error locations.

"Fast" methods for finding four or fewer errors are known, and we have developed a system for finding 5 errors with the aid of a relatively small lookup table that is discussed in co-pending patent application IMPROVED FIVE-ERROR CORRECTION SYSTEM, Ser. No. 08/984, 698 now U.S. Pat. No. 5,978,956. However, prior known systems that find the error locations for error locator polynomials of degree 6 or more perform time consuming Chien searches. A Chien search is a systematic trial and error approach that involves tying each element of the applicable Galois field as a root of the error locator equation. If the Galois Field is relatively large, the Chien search takes a long time, and thus, slows the error correction operation. An alternative to the Chien search is to use a lookup table that is entered with the 6 or more coefficients of the error locator polynomial. To correct even six errors, the associated lookup table is prohibitively large since it must include all possible distinct roots for the degree-six error locator polynomials. In GF($2^M$) the lookup table has $(2^M)^6$ entries. For systems that use 8-bit symbols, the lookup table has $(2^8)^6$ or $2^{48}$ entries, with each entry including six 8-bit roots of the error locator polynomial. For many systems, the lookup table takes up too much storage space. This is particularly true as larger Galois Fields are used to protect more data. Indeed, some systems may require that no lookup table is used.

SUMMARY OF THE INVENTION

An error correcting system for correcting "t" errors over GF($2^m$), where t is even and preferably greater than or equal to six, transforms the t-degree error locator polynomial into a polynomial in which $a_{t-1} \neq 0$, where $a_i$ is the coefficient of the $x^i$ term of the error locator polynomial. As necessary, the system further transforms the polynomial into one in which Tr($a_{t-1}) \neq 0$, where Tr($a_i$) is the trace of $a_i$ or a mapping of $a_i$ to an element of GF(2). Based on the non-zero trace of $a_{t-1}$, there are an odd number of roots that have traces equal to 1 and an odd number of roots that have traces equal to 0, since the sum of the roots of the polynomial is equal to $a_{t-1}$ and the sum of the traces of the roots is equal to the trace of the sum.

The roots of the polynomial are elements of GF($2^m$), and all elements of GF($2^m$) with traces equal to 0 are roots of $$S(x) = \sum_{i=0}^{m-1} x^{2^i},$$

and all elements with traces equal to 1 are roots of S(x)+1. Accordingly, the polynomial can be factored into two factors, namely, one factor that is the greatest common divisor of the polynomial and S(x) and a second factor that is the greatest common divisor of the polynomial and S(x)+1. If the two factors each have degrees less than or equal four, the system uses a fast method to determine the roots of each of the factors. The system then, as necessary, transforms these roots into the roots of the error locator polynomial. Otherwise, the system continues factoring until the degrees of the factors are less than or equal to some desired degree before it determines the roots of the factors.

Preferably, the system determines the greatest common divisor of the polynomial and S(x) in two steps, first iteratively determining a residue R(x)≡S(x)mod t(x), where t(x) is the polynomial that has the term $a_{t-1}$ with a trace of zero, and then calculating the greatest common divisor of t(x) and the lower-degree R(x). The system produces two factors of t(x), namely, g(x)=gcd(t(x), R(x)) and $$h(x) = \frac{t(x)}{g(x)}.$$

The system then determines the roots of the factors and transforms these roots into the roots of the error locator polynomial or, as necessary, continues factoring into factors of lower degree before determining the roots. We discuss the iterative technique for determining R(x) in more detail below.

When the degree of the error locator polynomial is odd, the system represents the roots $r_i$ of the error locator polynomial as a linear combination of $r_{i,k}\beta_k$ for k=0,1 . . . m−1, where $r_{i,k} \in GF(2)$ and $\beta_k$ is an element of a dual basis for $GF(2^m)$ over GF(2). Using the dual basis, $Tr(\alpha^j \beta_k)=1$ when j=k and equals 0 otherwise. The roots $r_i$ are then $$r_i = r_{i,0}\beta_0 + r_{i,1}\beta_1 + \ldots + r_{i,m-1}\beta_{m-1}$$

and $$Tr(\alpha^j r_i) = \sum_{k=0}^{m-1} r_{i,k} Tr(\alpha^j \beta_k) = r_{i,j}$$

The system determines a value for j for which the traces of the roots are not all zero or all one. The greatest common divisor of the error locator polynomial and $S(\alpha^j x)$ then has a degree less than t, as does the greatest common divisor of the error locator polynomial and $S(\alpha^j x)+1$. The system next determines the greatest common divisor of the polynomial and $S(\alpha^j x)$ by iteratively determining $R_j(x) \equiv S(\alpha^j x) \bmod c(x)$, where c(x) is the error locator polynomial, and then determining the greatest common divisor of c(x) and $R_j(x)$. If the degree of $R_j \geq 1$, the divisor is also a non-trivial factor of c(x). The system next determines two factors of c(x) as $g(x) = \gcd(c(x), R_j(x))$ and $$h(x) = \frac{t(x)}{g(x)}$$

and finds the roots as discussed above. We discuss the iterative technique for determining $R_j(x)$ in more detail below.

BRIEF DESCRIPTION OF THE DRAWINGS

The invention description below refers to the accompanying drawings, of which.

DETAILED DESCRIPTION OF AN ILLUSTRATIVE EMBODIMENT

An error correction system operating in accordance with the current invention produces in a known manner as error locator polynomial $$c(x) = a_t x^t + a_{t-1} x^{t-1} + \ldots + a_{t-2} x^{t-2} + \ldots a_1 x + a_0$$

over $GF(2^m)$. If the degree t of the error locator polynomial is small enough, the system uses known fast methods to find the roots. Generally, the known fast methods find the roots of polynomials of degree 4 or less. If the degree $t \geq 5$, the system follows the operations of FIG. 1, if t is even, or FIG. 4 if t is odd.

A. Even-degree Error Locator Polynomial

Figure 1A:
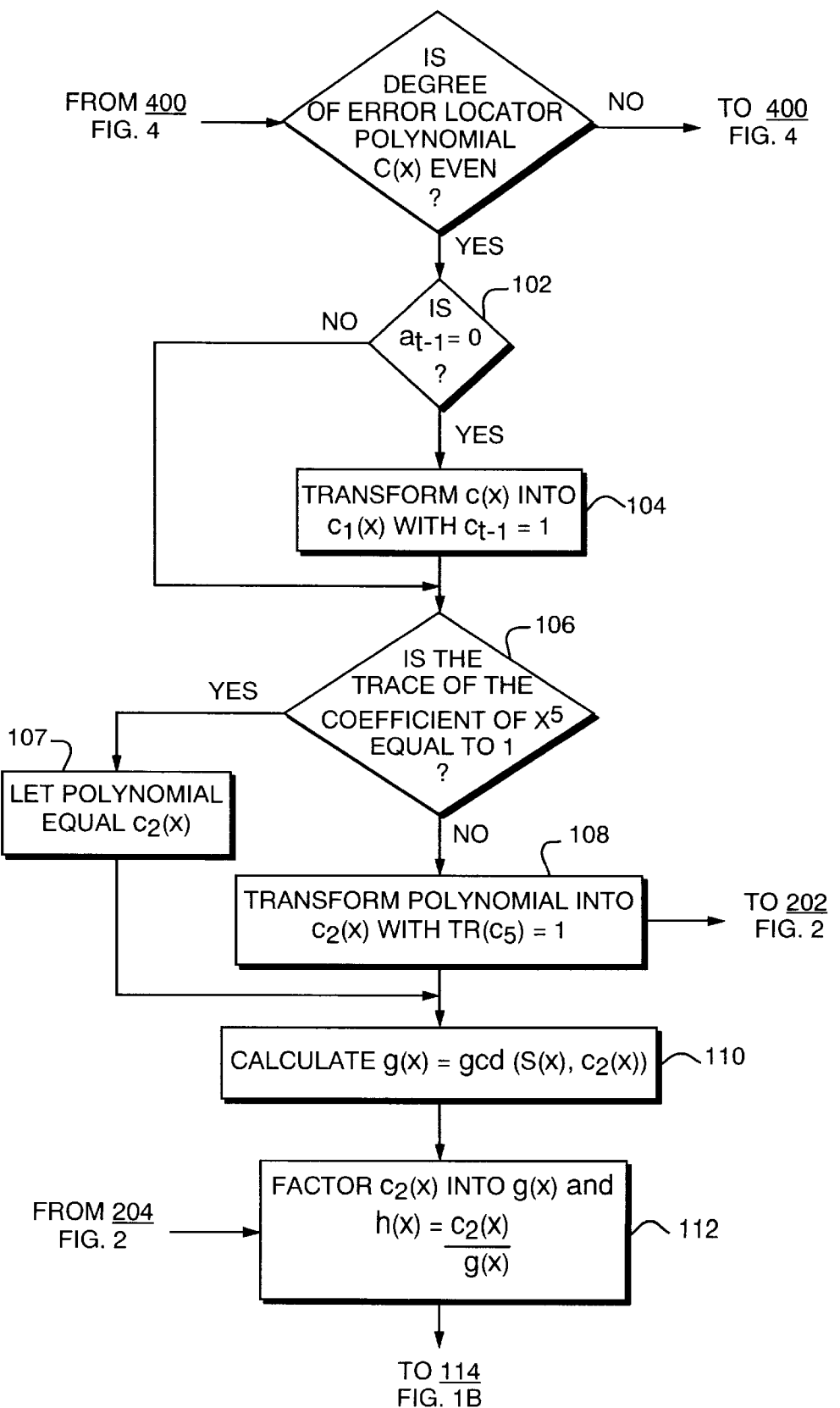
FIG. 1 is a flow chart of the operations of determining the roots of an even-degree error locator polynomial.
Figure 1B:
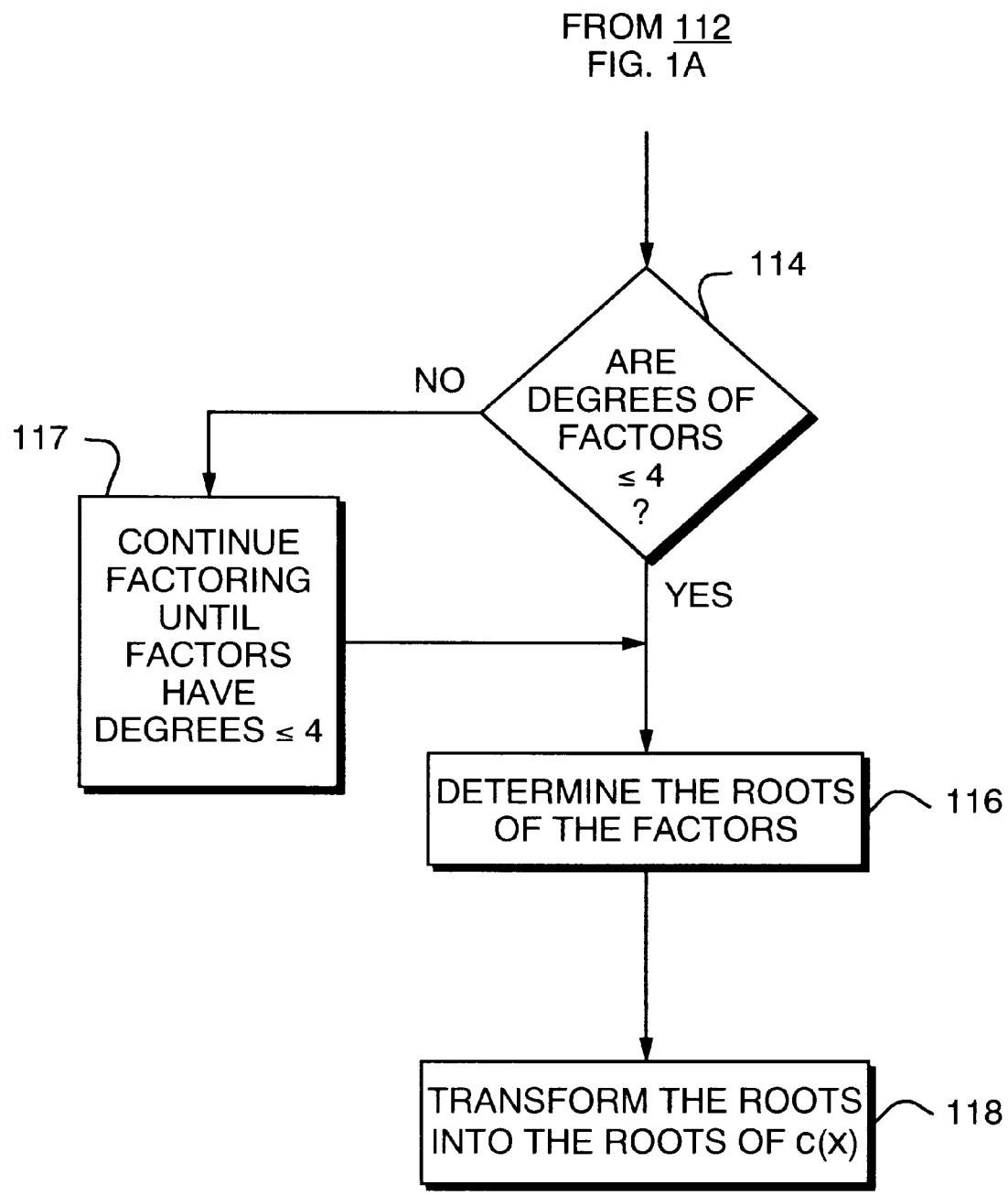

Referring now to FIG. 1 if t is even (step 100), the system checks if $a_{t-1}=0$ (step 102). If so, the system transforms c(x) into $c_1(x)$ with $a_{t-1}=1$ (step 104). Otherwise, the system goes on to step 106.

As an example, c(x) is a degree 6 polynomial $$c(x) = x^6 + a_5 x^5 + a_4 x^4 + a_3 x^3 + a_2 x^2 + a_1 x + a_0$$

with $a_5=0$. In order for c(x) to have t distinct, non-zero roots, $a_0 \neq 0$. Further, at least one of $a_1$ and $a_3$ must be non-zero. Otherwise, c(x) is the square of a degree 3 polynomial. To transform c(x) into $c_1(x)$ with $a_5 \neq 0$, the system first checks that $a_1$ is non-zero. If so, the system produces $$c_1(x) = \frac{1}{a_0} x^6 c\left(\frac{1}{x}\right) = x^6 + \frac{a_1}{a_0} x^5 + \frac{a_2}{a_0} x^4 + \frac{a_3}{a_0} x^3 + \frac{a_4}{a_0} x^2 + \frac{1}{a_0}$$

such that for each root $r_i$ of $c_1(x)$, $$\frac{1}{r_i}$$

is a root of c(x).

When $a_1=0$, the system checks if c(1)=0 and if so it directly factors c(x) into g(x)=x−1 and $$h(x) = \frac{c(x)}{g(x)},$$

which are, respectively, degree 1 and degree 5 polynomials. The system may then use a look-up table to determine the roots of h(x) or it may factor h(x) in accordance with the operations discussed below with reference to FIG. 4.

With $a_1=0$ and $c(1) \neq 0$, the system transforms c(x) into $c_0(x) = c(x+1)$:

$$c_0(x) = x^6 + (a_4+1)x^4 + a_3 x^3 + (a_3+a_2+1)x^2 + a_3 x + c(1),$$

and then transforms $c_0(x)$ into $$c_1(x) = \frac{1}{c(1)} x^6 c_0\left(\frac{1}{x}\right):$$

$$c_1(x) = x^6 + \frac{a_3}{c(1)}x^5 + \frac{a_3 + a_2 + 1}{c(1)}x^4 + \frac{a_3}{c(1)}x^3 + \frac{a_4 + 1}{c(1)}x^2 + \frac{1}{c(1)}$$

such that for each root $r_i$ of $c_1(x)$, $$1 + \frac{1}{r_i}$$

is a root of $c(x)$.

Once the system has produced a polynomial with a non-zero coefficient $c_5$ of $x^5$, the system (step 106) determines $\text{Tr}(c_5)$, where Tr is the trace, or a mapping, of an element of $GF(2^m)$ to an element of $GF(2)$. The trace of y $\in GF(2^m)$, which is defined as $$Tr(y) = \sum_{i=0}^{m-1} y^{2^i},$$

is thus equal to 1 or 0.

Every element of $GF(2^m)$ is a root of $x^{2^m}-x$. Each element is thus a root of one of the two factors of $x^{2^m}-x$, namely, $$S(x) = \sum_{i=0}^{m-1} x^{2^i}$$

and $S(x)+1$, which have no common factors. The trace of an element y is equal to $S(y)$, and the element y is a root of $S(x)$ if $\text{Tr}(y)=0$. Otherwise, the element y has a trace of 1 and is a root of $S(x)+1$.

There are an even number of roots of the polynomial. The sum of the roots is equal to $c_5$, and if $\text{Tr}(c_5)=1$, the sum of the traces of the roots is equal to 1. Accordingly, there are an odd number of the roots of the polynomial are also roots of $S(x)+1$, and at least one root of the polynomial that is also a root of $S(x)$. The polynomial can thus be factored into at least a degree one factor and a degree five factor.

Referring still to FIG. 1, the system checks if the trace of $c_5$ is non-zero (step 106). If so, the system factors the polynomial, call it $c_2(x)$ (step 107), by determining the greatest common divisors of $c_2(x)$ and each of $S(x)$ and $S(x)+1$. Preferably, the system, in step 110, determines $g(x)=\gcd(S(x), c_2(x))$ and then, in step 112, determines $h(x)=\gcd((S(x)+1), c_2(x))$ as $$h(x) = \frac{c_2(x)}{g(x)}.$$

The system next determines the roots of the factors (step 114b) and transforms the roots into the roots of the error locator polynomial $c(x)$ essentially by reversing the transformation from $c(x)$ to $c_2(x)$ (step 118). Alternatively, before determining the roots, the system may continue factoring (steps 114, 117) until factors of degree 4 or less are produced.

If $\text{Tr}(c_5)=0$, the system transforms the polynomial into one in which the trace of the coefficient of $x^5$ is equal to one (step 108). Accordingly, the system selects an element z of $GF(2^m)$ for which $\text{Tr}(z)=1$ by, for example, trying successive powers of $\alpha^i$. In the example, the system transforms the polynomial $c_1(x)$ into $c_2(x)$ by first defining $$\gamma = \frac{a_5}{z}$$

and then determining $c_2(x)=\gamma^{-6}c_1(\gamma x)$:

$$c_2(x) = \gamma^{-6}\left[\frac{c_5^6}{z^6}\gamma^6 x^6 + \frac{c_5^6}{z^5}x^5 + c_4\gamma^4 x^4 + c_3\gamma^3 x^3 + c_2\gamma^2 x^2 + c_1\gamma x + c_0\right]$$

$$= x^6 + zx^5 + c_4'x^4 + c_3'x^3 + c_2'x^2 + c_1'x + c_0'$$

where $c_i'=c_i\gamma^{i-6}$ for $i=0, 1, \ldots, 4$, and for each root $r_i$ of $c_2(x)$, $\gamma r_i$ is a root of $c_1(x)$. With the coefficient of $x^5$ in $c_2(x)$ having a trace of 1, $c_2(x)$ can be factored into $g(x)$ and $h(x)$, with each factor having degree five or less, as discussed above with reference to steps 110–116.

Figure 2:
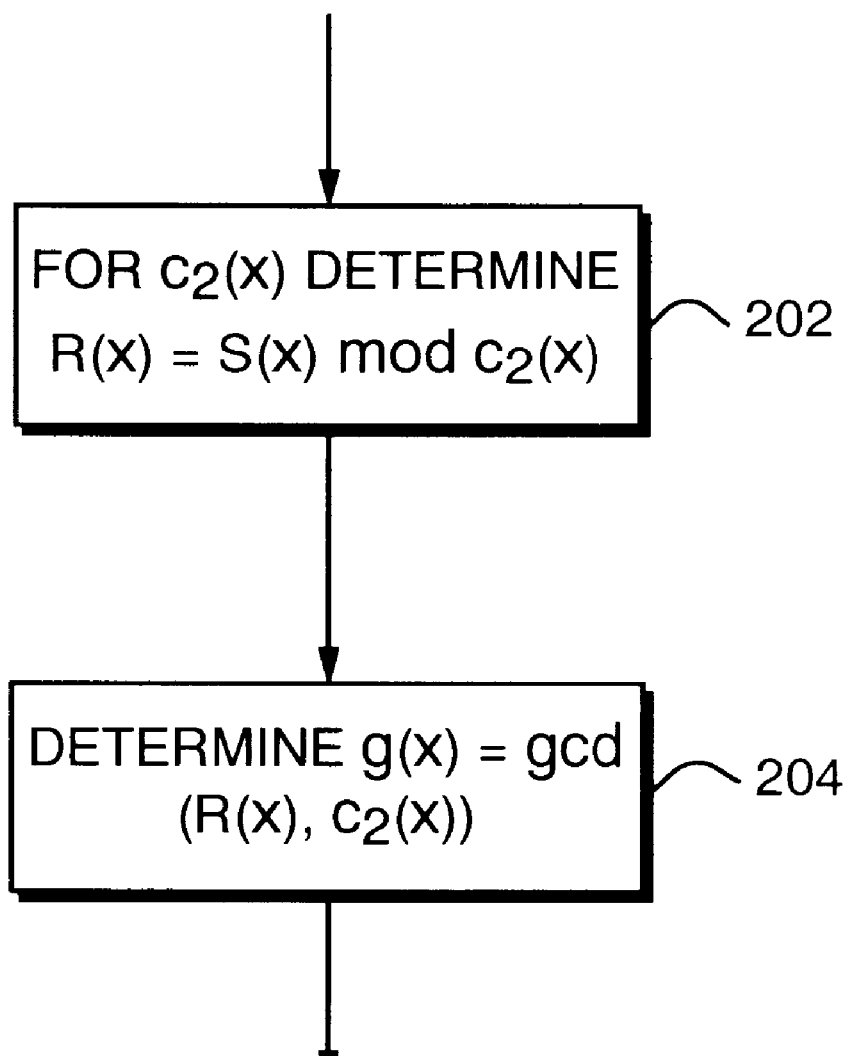
FIG. 2 is a flow chart of the operations of the system for determining a residue.

Referring now to FIG. 2, the polynomial $S(x)$ has a degree of $2^{m-1}$, and determining the greatest common divisor of $S(x)$ and $c_2(x)$ is very time consuming. To reduce the time involved, the system preferably produces (step 202) a residue $R(x) \equiv S(x) \bmod c_2(x)$, which necessarily has a degree that is less than the degree of $c_2(x)$, and then (step 204) determines $g(x)=\gcd(R(x), c_2(x))$ using, for example, the Euclidean algorithm.

In the example m=4, and $GF(2^4)$ is generated by $x^4+x+1$ with $\alpha$ as a primitive element. For a degree 6 polynomial $$c_1(x)=x^6+\alpha^9 x^5+\alpha^{12}x^4+\alpha^3 x^3+\alpha^2 x^2+\alpha^4 x+1$$

a selected element $z=\alpha^3$ of $GF(2^4)$ with a trace 1, and $$\gamma = \frac{\alpha^9}{\alpha^3} = \alpha^6,$$

the system produces $$c_2(x) = \frac{c_1(\gamma x)}{\gamma^6} = \frac{c_1(\alpha^6 x)}{\alpha^6}$$

$$= x^6 + \alpha^3 x^5 + x^4 + \alpha^{13}x^3 + \alpha^8 x^2 + \alpha^4 x + \alpha^9$$

With $S(x)=x^8+x^4+x^2+x$, the residue $R(x)=x^8+x^4+x^2+x \bmod c_2(x)$ or $$R(x)=\alpha^{10}x^5+\alpha^7 x^4+\alpha^4 x^3+\alpha^6 x^2+\alpha^9 x+\alpha^7$$

The system then determines $g(x)=\gcd(R(x), c_2(x))=x-\alpha^{10}$. The remaining factor $$h(x) = \frac{c_2(x)}{g(x)} = x^5 + \alpha^{12}x^4 + \alpha^9 x^3 + \alpha^{11}x^2 + \alpha^{14}x + \alpha^{14}.$$

The system may then determine the roots of $g(x)$ and $h(x)$, as discussed above, or it may continue to factor $h(x)$, as discussed below with reference to FIG. 4.

The degree of $S(x)=2^{m-1}$, and the calculation of $R(x)$ in a conventional manner requires $2^{m-1}$ clock cycles, which is still too time consuming for many systems. Accordingly, the system preferably determines $R(x)$ iteratively, taking advantage of the properties of $S(x)$.

For $$c_2(x)=x^6+c_5x^5+c_4x^4+c_3x^3+c_2x^2+c_1x+c_0,$$

we define:

$$\theta(x)\equiv c_5x^5+c_4x^4+c_3x^3+c_2x^2+c_1x+c_0 \text{ and } x^6\equiv\theta(x)\bmod c_2(x).$$

Using $x^6$ we can calculate $x^8 \bmod c_2(x)=x^2*x^6=x^2\theta(x)\bmod c_2(x)$. We then define $$x^8 \bmod c_2(x)\equiv\theta_3(x)=b_{3,5}x^5+b_{3,4}x^4+b_{3,3}x^3b_{3,3}x^3+b_{3,2}x^2+b_{3,1}x+b_{3,0}$$

where the coefficient identifier, for example, "3,5" indicates $b_{3,5}$ is the coefficient of the term $x^5$ in $\theta_3$. The coefficients we thus $b_{3,5}=c_5^3+c_5c_4+c_4c_5+c_3=c_5^3+c_3$
$b_{3,4}=c_5^2c_4+c_5c_3+c_4^2+c_2$
$b_{3,3}=c_5^2c_3+c_5c_2+c_4c_3+c_1$
$b_{3,2}=c_5^2c_2+c_5c_1+c_4c_2+c_0$
$b_{3,1}=c_5^2c_1+c_5c_0+c_4C_1$
$b_{3,0}=c_5^2c_0+c_4c_0$ We can also calculate $x^{10} \bmod c_2(x)$ as $x^2*x^8=x^2\theta_3(x)\bmod c_2(x)$, and define $$x^{10} \bmod c_2(x)\equiv\theta^*(x)=d_5x^5+d_4x^4+d_3x^3+d_2x^2+d_1x+d_0$$

where $d_5=(c_5^2+c_4)b_{3,5}+c_5b_{3,4}+b_{3,3}$
$d_4=(c_5c_4+c_3)b_{3,5}+c_4b_{3,4}+b_{3,2}$
$d_3=(c_5c_3+c_2)b_{3,5}+c_3b_{3,4}+b_{3,1}$
$d_2=(c_5c_2+c_1)b_{3,5}+c_2b_{3,4}+b_{3,0}$
$d_1=(c_5c_1+c_0)b_{3,5}+c_1b_{3,4}$
$d_0=(c_5c_0)b_{3,5}+c_0b_{3,4}$ Then, based on $\theta(x)$, $\theta_3(x)$ and $\theta^*(x)$, the system can iteratively calculate, in m−4 iterations, $\theta_i(x)\equiv x^{2^i} \bmod c_2(x)$ for i=4,5, . . . m−1, as $$x^{2^i} \equiv \theta_i(x) \bmod c_2(x) = b_{i,5}x^5 + b_{i,4}x^4 \ldots + b_{i,1}x + b_{i,0}$$
$$= b_{i-1,5}^2\theta_*(x) + b_{i-1,4}^2\theta_3(x) + b_{i-1,3}^2\theta(x) + b_{i-1,2}^2x^4 +$$
$$b_{i-1,1}^2x^2 + b_{i-1,0}^2$$

Adding the $\theta_i(x)$ terms and the terms for k=0, 1 and 2, the residue is:

$$R(x) = x + x^2 + x^4 + \sum_{i=3}^{m-1}\Theta_i(x)$$

The mod $c_2(x)$ operation is calculated with $\theta(x)$, $\theta_3(x)$ and $\theta^*(x)$ because the highest degree term at the completion of an iteration is degree 5, which in a next iteration is squared to degree 10 term.

Figure 3:
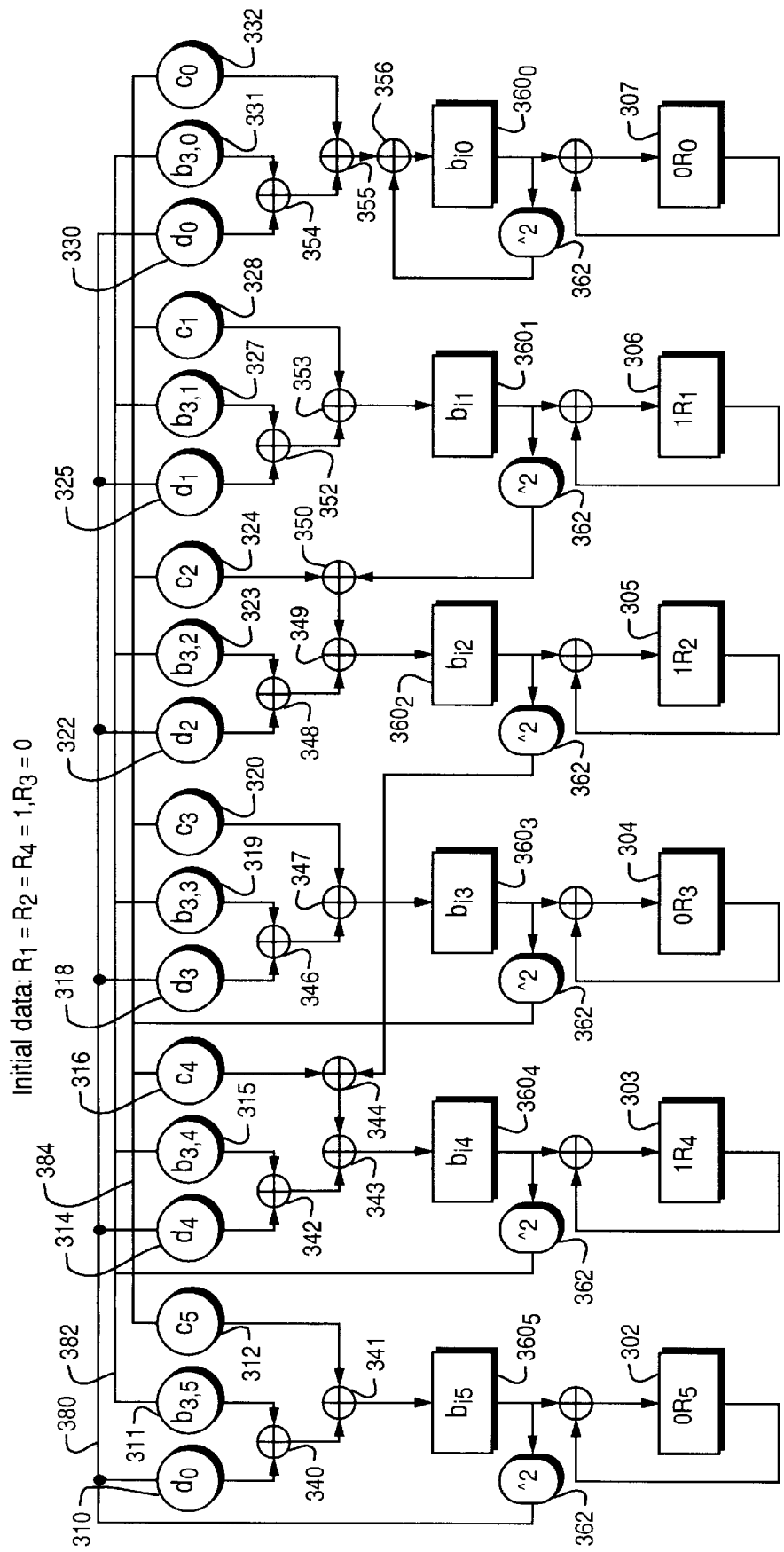
FIG. 3 is a functional block diagram of a circuit for iteratively determining coefficient of the residue used by the system of FIG. 2.

FIG. 3 depicts a circuit 300 for iteratively calculating the coefficients $R_1, R_2 \ldots R_5$ of R(x) for a degree 6 error locator polynomial. Registers 303–307 are initialized with $R_1$, $R_2$ and $R_4$ set to 1 and $R_3$ and $R_5$ set to zero. The set of multipliers 310–312 contain the coefficients $d_5$, $b_{3,5}$ and $c_5$, respectively, that are associated with the $x^5$ term in each of the polynomials $\theta(x)$, $\theta_3(x)$ and $\theta^*(x)$. The remaining sets of multipliers 318–320, 322–324, 326–328 and 330–332 contain, respectively, the coefficients associated with the $x^4$, $x^3$, $x^2$, $x^1$ and $x^0$ terms in each of the polynomials $\theta^*(x)$, $\theta_3(x)$ and $\theta(x)$.

The registers 360$_5$, 360$_4$, 360$_3$, 360$_2$, 360$_1$, and 360$_0$ are initially set to the coefficients of the associated terms of $\theta_3(x)$ which are, respectively, the coefficients $b_{i-1,5} \ldots b_{i-1,0}$ for the iteration i=4. These registers are then updated in each iteration, and the updated values are added to the contents of the registers 303–307. The sums then update the registers 303 and 307. After m−3 iterations, the registers 303–307 contain the coefficients of the residue R(x).

More specifically, during a first iteration the contents of the registers 360$_j$, are each squared in multipliers 362. The product $(b_{3,5})^2$ is supplied over line 380 to the multipliers 310, 314, 318, 322, 326 and 330 to produce the coefficients of $(b_{i-1,5})^2\theta^*(x)$. At the same time the product $(b_{3,4})^2$ is supplied over line 382 to multipliers 311, 315, 319, 323, 327 and 331 to produce the coefficients of $(b_{i-1,4})^2\theta_3(x)$ and the product $(b_{3,3})^2$ is supplied over line 384 to the multipliers 312, 316, 320, 324, 328 and 332 to produce the coefficients of $(b_{i-1,3})^2\theta(x)$. The products $(b_{3,2})^2$, $(b_{3,1})^2$ and $(b_{3,0})^2$ are, respectively, supplied to adders 344, 350 and 356 which are associated with the coefficients of $x^4x^2$ and $x^0$. The adders 340, 342, 344, 346, 348, 350, 352 and 354 then add the associated products, and the sums are next added to various products and sums in adders 341, 343, 347, 349, 353 and 355, with the sum produced by the adder 355 added to the product $(b_{3,0})^2$ in an adder 356. The sums update the contents of the registers 360$_j$ as the coefficients $b_{4j}$ required for the next iteration, and the updated coefficients are then added, respectively, to the contents of the registers 302–307, to produce the updated coefficients of R(x) for the current iteration.

The circuit 300 iteratively updates the coefficients of R(x) for the remaining clock cycles i=5, 6 . . . m−1 . . . m−1. Accordingly, the residue R(x) is calculated in m−3 clock cycles after $\theta^*(x)$, $\theta_3(x)$ and $\theta(x)$ are determined. If conventional circuits are used to produce $\theta^*(x)$, $\theta_3(x)$ and $\theta(x)$, the residue R(x) is calculated in approximately m+14 clock cycles rather than the $2^{m-1}$ clock cycles required by known prior systems. The current system then determines g(x)=gcd (R(x), $c_2(x)$) in a conventional manner, and produces the associated roots of g(x) and h(x) as discussed above.

For systems that can correct more errors, the circuit 300 contains additional registers and associated multipliers and adders that include in the iterations the coefficients of additional polynomials $\theta_4(x)$, $\theta_5(x) \ldots$, $\theta_u(x)$, and $\theta^*_i$, $\theta^*_{i+1} \ldots$ that correspond to $x^t$, $x^{t+2} \ldots x^{2(t-1)}$, where u=[ln t].

For example, a system that corrects up to 10 errors defines $$x^{10}\equiv\theta(x)=c_9x^9+c_8x^8+ \ldots +c_0$$

and then calculates $x^{12}=x^2x^{10} \bmod c(x)=x^2\theta(x)\equiv\theta^*_1(x)$
$x^{14}=x^2x^{12} \bmod c(x)=x^2\theta^*_1(x)\equiv\theta^*_2$
$x^{16}=x''=x^2x^{12}\equiv\theta_4(x)$
$x^{18}=x^{2(t-1)}=x^2x^{16}\equiv\theta^*_3$ Based on these polynomials the system can iteratively determine $\theta_k \bmod c(x)$ for k=u,u+1 . . . m−1. Accordingly, the set of multipliers associated with each register 360$_j$ in the circuit for iteratively generating the coefficients of the residue includes the appropriate coefficients of the polynomials $\theta(x)$, $\theta^*_1(x)$, $\theta^*_2(x)$, $\theta^*_4(x)$ and $\theta^*_3(x)$ and produces the coefficients of:

$$R(x) = x + x^2 + x^4 + x^8 + \sum_{i=4}^{m-1} \theta_i(x)$$

B. Odd-degree Error Locator Polynomial

Figure 4:
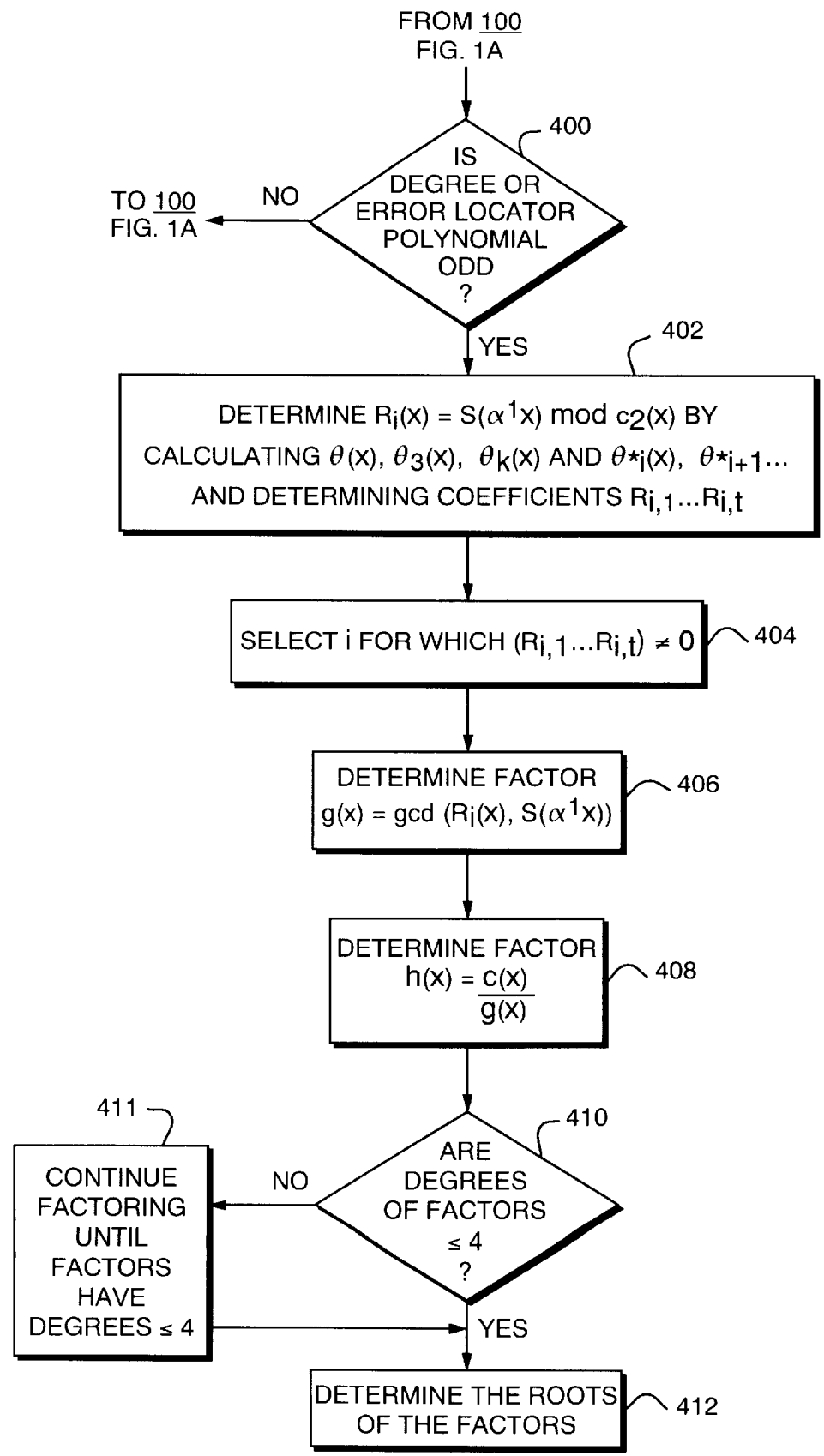
FIG. 4 is a flow chart of the operations of the system for determining the roots of an odd-degree error locator polynomial.

Referring now to FIG. 4, if the degree of the error locator polynomial is odd (step 400), the system determines the roots using a dual basis $\beta_0, \beta_1 \ldots \beta_{m-1}$ over GF(2) rather than in the basis $\alpha^0, \alpha^1 \ldots \alpha^{m-1}$. In the dual basis, $$Tr(\alpha^i \beta_j) = 0 \text{ if } i \neq j$$
$$= 1 \text{ if } i = j$$

The roots are then:

$$r_q = r_{q,0}\beta_0 + r_{q,1}\beta_1 + r_{q,2}\beta_2 + \ldots + r_{q,m-1}\beta_{m-1}$$

for $q=1, \ldots, t$, and $r_{qj} \in GF(2)$ for $j=0 \ldots, m-1$, and $$Tr(\alpha^j r_q) = \sum_{k=0}^{m-1} r_{q,k} Tr(\alpha^j \beta_k) = r_{q,j}.$$

For t distinct roots, there exists a $k_0$ such that $r_{1,k}, r_{2,k} \ldots r_{n,k}$ are not all ones or all zeros, and thus, there are two roots $r_{i_1}$ and $r_{i_2}$ out of the set of roots $r_j$ such that $r_{i_1, k_0}=1$ and $r_{i_2, k_0}=0$. The traces of $\alpha^{k_0} r_{i_1}$ and $\alpha^{k_0} r_{i_2}$ are then 1 and 0, which means that $g(x)=\gcd(S(\alpha^i x), c(x))$ has degree of t−1 or less, as does $h(x)=\gcd(S(\alpha^i x)+1, c(x))$. The system must, however, determine if $g(x)$ is a non-trivial factor of $c(x)$ to determine if $c(x)$ can be factored.

Referring still to FIG. 4, the system (step 402) determines a residue which is now $R_i(x) \equiv S(\alpha^i x) \mod c(x)$. If $R_i(x)=0$, $c(x)$ divides $S(\alpha^i x)$, and $S(\alpha^i x)+1$ and $c(x)$ have no common divisor. If $R_i(x)=a$, where a is a non-zero element of $GF(2^m)$, $c(x)$ divides $S(\alpha^i x)+1$, and $S(\alpha^i x)$ and $c(x)$ have no common divisor. Thus, in either of these cases $g(x)$ is a trivial factor of $c(x)$. If, however, $R_i(x)$ has degree $\geq 1$, there exists a polynomial $p_i(x)$ such that $$S(\alpha^i x) = R_i(x) + c(x)p_i(x)$$

and $c(x)$ divides neither $S(\alpha^i x)$ nor $S(\alpha^i x)+1$. Accordingly, $g(x)$ is a non-trivial factor of $c(x)$.

For $R_i(x)$ to have degree one or greater, the coefficients of the terms $x^{t-1}, x^{t-2}, \ldots, x$ cannot all be zeros. For $$R_i(x) = R_{i,t-1} x^{t-1} + \ldots + R_{i,1} x + R_{i,0}$$

the vector $(R_{i,t-1}, \ldots R_{i,1})$ thus cannot equal the all 0 vector of $R_i(x)$, the system uses the polynomials $\theta(x)$, $\theta_3(x)$ and so forth discussed above. As an example, for a degree 5 polynomial $$c(x) = c_5 x^5 + c_4 x^4 + c_3 x^3 + c_2 x^2 + c_1 x + c_0$$

$$x^6 \equiv \theta(x) \mod c(x) = v_4 x^4 + v_3 x^3 + v_2 x^2 + v_1 x + v_0$$

where
$v_4 = c_4^2 + c_3$
$v_3 = c_4 c_3 + c_2$
$v_2 = c_4 c_2 + c_1$
$v_1 = c_4 c_1 + c_0$
$v_0 = c_4 c_0$ and $$x^8 \equiv \theta_3(x) = x^2 \theta(x) \mod c(x) = b_{3,4} x^4 + b_{3,3} x^3 + b_{3,2} x^2 + b_{3,1} x + b_{3,1}$$

where
$b_{3,4} = b_4^2 + c_4 b_3 + b_2$
$b_{3,3} = b_4 b_3 + c_3 b_3 + b_1$
$b_{3,2} = b_4 b_2 + c_2 b_3 + b_0$
$b_{3,1} = b_4 b_1 + c_1 b_3 +$
$b_{3,0} = b_4 b_0 + c_0 b_3$ There is no need to calculate $\theta^*(x)$ because the highest degree per iteration is $x^8$. Accordingly, the system determines $\theta_k(x) \equiv x^{2^k} \mod c(x)$ for $k=4, 5, \ldots, m-1$ as follows:

$$\theta_k(x) = b_{k,4} x^4 + b_{k,3} x^3 + b_{k,2} x^2 + b_{k,1} x + b_{k,1} = b^2_{k-1,4} \theta_3(x) + b^2_{k-1,3} \theta(x) + b^2_{k-1,2} x^4 + b^2_{k-1,1} x^2 + b^2_{k-1,0}$$

Also, there exists a polynomial $p_k(x)$ such that $$x^{2^k} = \sum_{j=0}^{t-1} b_{k,j} x^j + c(x) p_k(x)$$

Generalizing, $$(\alpha^i x)^{2^k} = \alpha^{2^k i} \left( \sum_{j=0}^{t-1} b_{k,j1} x^j \right) + \alpha^{2^k i} c(x) p_k(x)$$

for $i=0, 1 \ldots m-1$, which implies that $$(\alpha^i x)^{2^k} \equiv \sum_{j=0}^{t-1} \alpha^{2^k i} b_{k,j} x^j \mod c(x)$$

and, therefore, $$R_i(x) = \alpha^i x + \alpha^{2i} x^2 + \alpha^{4i} x^4 + \sum_{k=3}^{m-1} \sum_{j=0}^{t-1} \alpha^{2^k i} b_{k,j} x^j \equiv S(\alpha^i x) \mod c(x)$$

or $$R_{i,4} = \alpha^{4i} + \sum_{k=3}^{m-1} \alpha^{2^k i} b_{k,4}$$

$$R_{i,3} = \sum_{k=3}^{m-1} \alpha^{2^k i} b_{k,3}$$

$$R_{i,2} = \alpha^{2i} + \sum_{k=3}^{m-1} \alpha^{2^k i} b_{k,2}$$

$$R_{i,1} = \alpha^i + \sum_{k=3}^{m-1} \alpha^{2^k i} b_{k,1}$$

The system determines the set of coefficients for $i=0, \ldots m-1$ and selects a value of i for which at least one of the coefficients is non zero (step 404). The system then determines the greatest common divisor of $R_i(x)$ and $c(x)$ and so forth (steps 406–412).

Figure 5:
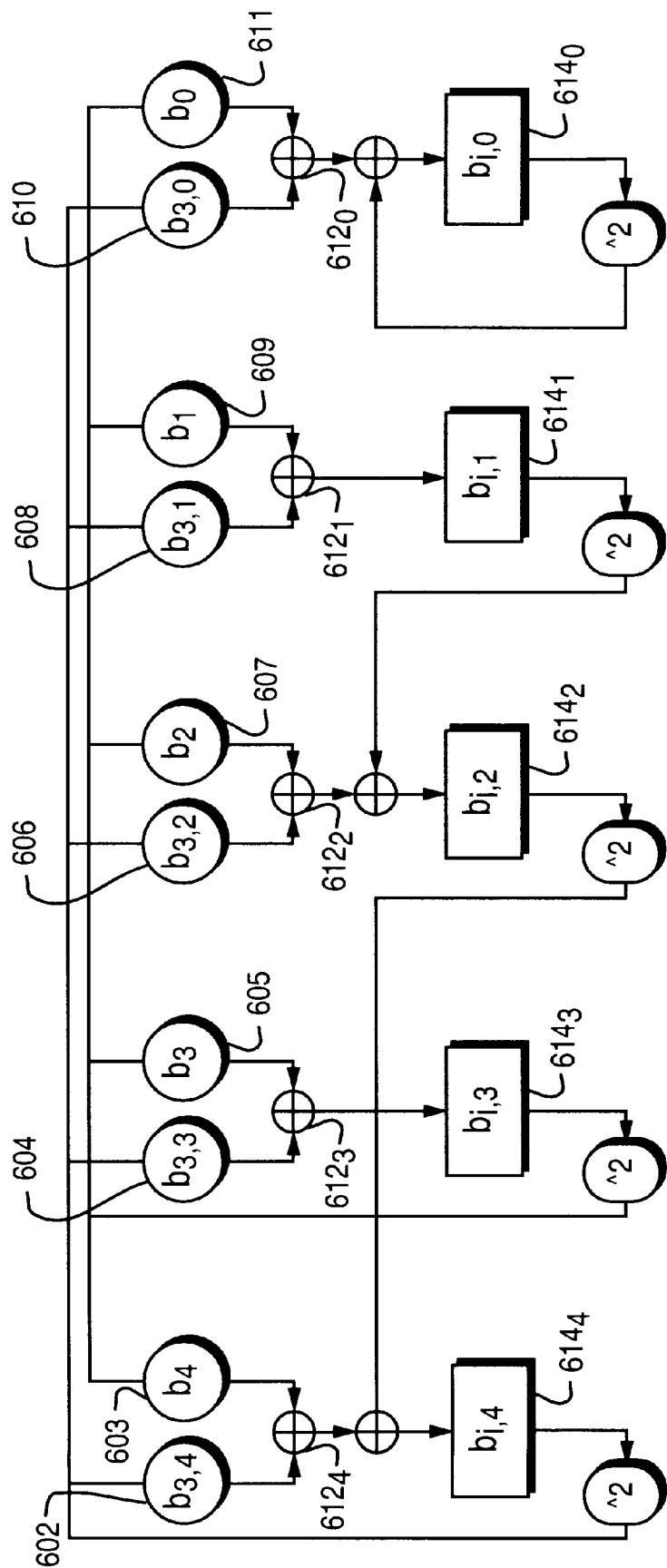
FIG. 5 is a functional block diagram of a circuit for iteratively determining the coefficients of a residue used by the system of FIG. 4.

The coefficients $b_{k,j}$ can be determined iteratively. Referring now to FIG. 5, sets of multipliers 602–603, 604–605, 606–607, 608–609 and 610–611 multiply the products of $b^2_{i-1,4}$ by the coefficients of $\theta_3(x)$ and $\theta(x)$. The products are then summed in adders 612$_j$, $j=0$ to $t-1$ and the sums associated with $x^4$, $x^2$ and $x$ are added to the products $b^2_{i,2}$, $b^2_{i,1}$ and $b^2_{i,0}$ in adders 614$_4$, 614$_2$ and 614, respectively. The sums produced by these adders and the sums produced by the adders $612_3$ and $612_i$ update the registers $616_j$, that hold the coefficients $b_{i,j}$ for i=4, 5, . . . m−1. At the end of m−3 iterations, the registers $616_j$ hold the coefficients of $x^{2^i}$ mod c(x).

The system may instead determine a residue $R_i(x)$ with degree greater than or equal to 1 by testing for $R_{k,1}=1$ for k=0, . . . , m−1. For $R_{k,1}=1$, the system then determines the remaining coefficients of $R_k(x)$ using the iterative method, and calculates g(x) and the roots of g(x) as discussed above.

For a non-trivial g(x), that is, for an $R_i(x)$ with degree≧1, there exists at least one coefficient $R_{k,1}\neq 0$ for k=0, 1 . . . m−u, where u=⌈ln t⌉. Consider the polynomial $S(\alpha^i x)=R_i(x)+c(x, q(x)$, which in the example has degree 8, and a c(x) with degree 5 and $c_5=1$. The polynomial q(x) thus has degree 8, with $$S(x)=(\alpha^i x)^8+(\alpha^i x)^4+(\alpha^i x)^2+\alpha^i x \text{ and } q(x)=\alpha^{8i}x^3+p_i(x),$$

and $p_i(x)$ has degree ≦2. This means that $p(x)=p_{i,2}x^2+p_{i,1}x+p_{i,0}$ and we can determine the coefficients of $p_i(x)$ for i=0:

$$p_{0,2}=a_4;\ p_{0,1}=a_3+a_4^2;\ p_{0,0}=a_4^3+a_2$$

and $$R_{0,1}=P_{0,1}a^0+P_{0,0}a_1$$

For i=1, the coefficients are:
$p_{1,2}=\alpha^8 a_4=\alpha^8 p_{0,2}$
$p_{1,1}=\alpha^8(a_3+\alpha^2_4)=\alpha^8 p_{0,1}$
$p_{1,0}=\alpha^8(a_2+\alpha^3_4)=\alpha^8 p_{0,0}$
and
$R_{1,1}=p_{1,1}a_0+p_{1,0}a_1+\alpha$
If the two coefficients $R_{0,1}$ and $R_{1,1}$ are equal, $$\alpha=p_{1,1}a_0+p_{1,0}a_1=\alpha^8(p_{01}a_0+p_{0,0}a_1)=\alpha^8$$

which contradicts the fact that α is a primitive element of $GF(2^m)$. Accordingly, $R_{0,1}\neq R_{1,1}$ and one of the coefficients is equal to 1 while the other is equal to 0. In the example, the system tests $R_{i,1}$ for i=0 and 1, that is, it tests to m−3, and selects for the value of i the first value for which $R_{i,1}=1$.

Figure 6:
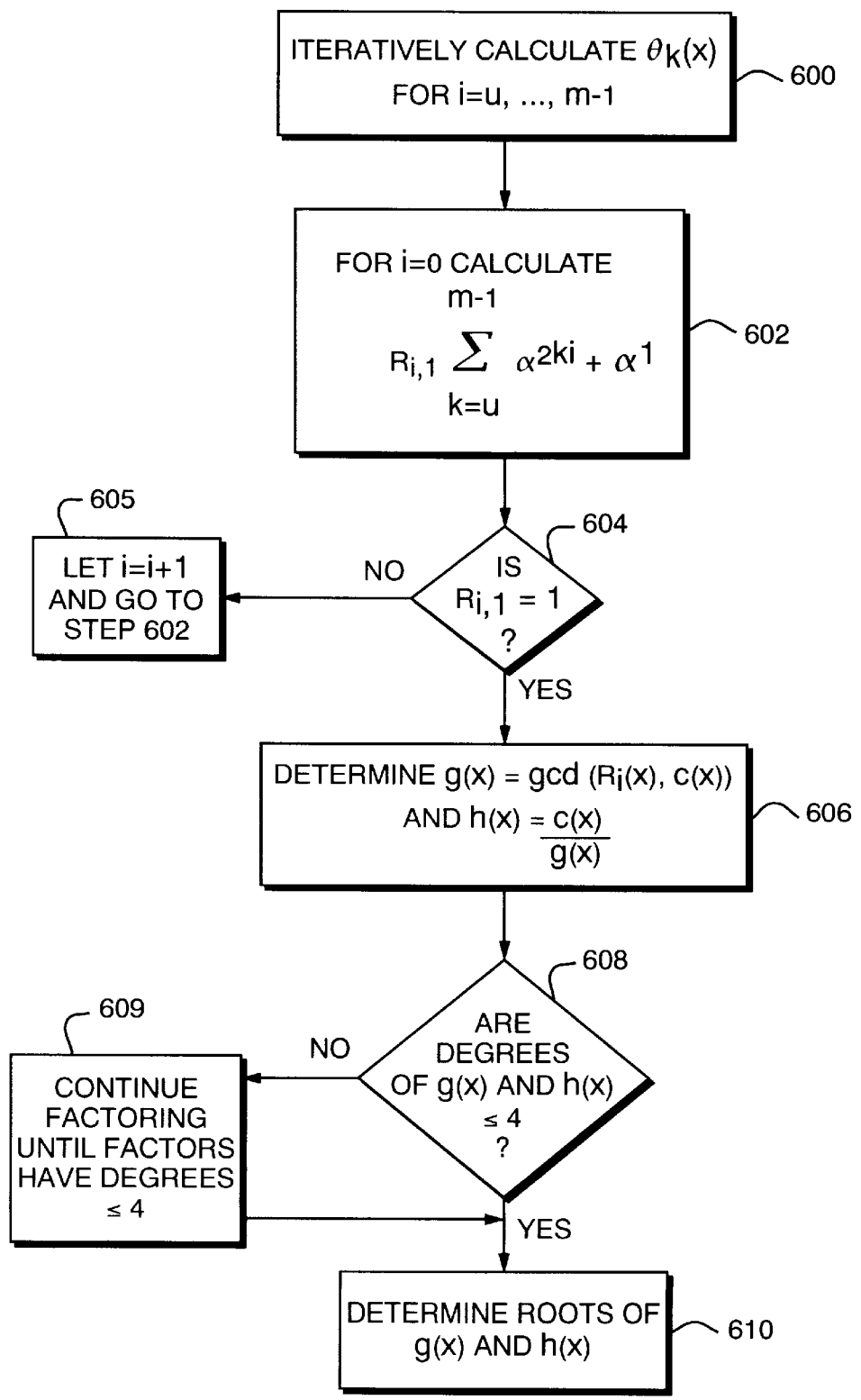
FIG. 6 is a flow chart of the operations of the system that include steps of iteratively determining residues.

Referring now to FIG. 6, the system (step 600) determines $R_i(x)$ with degree ≧1 by first calculating $$\theta_k(x)=b_{k,4}x^4+b_{k,3}x^3+b_{k,2}x^2+b_{k,1}x+b_{k,0}$$

for k=u, u+1, . . . m−1 using the iterative method described above.

The system (step 602) then starts from i=0 and determines:

$$R_{i,1}=\sum_{k=u}^{m-1}\alpha^{2^k i}b_{k,1}+\alpha^i$$

If $R_{i,1}\neq 0$, the system computes $R_i(x)$ and determines g(x)= gcd($R_i(x)$, c(x)) as discussed above (steps 604,606). The system then determines (steps 608–610) the roots of g(x) and h(x). If $R_{i,1}=0$, the system lets i=i+1 (step 605), and again determines if $R_{i,1}\neq 0$. Once $R_{i,1}\neq 0$, the system determines g(x) and h(x) and the associated roots (steps 604, 606–610). The system thus determines the roots of c(x) in far fewer clock cycles than the known prior systems, which use the Chien search, and thus, try as the roots of c(x) all of the elements of $GF(2^m)$.

After the system determines a residue and factors the polynomial using either the odd-degree or even-degree operations discussed above, the system uses these operations as appropriate, to continue factoring, for example, g(x) and h(x), and factors that result from the further factoring.

What is claimed is:

1. A method for determining which symbols in a code word contain errors based on a degree-t error locator polynomial over $GF(2^m)$, with t even and greater than or equal to six, the method including the steps of:

A. determining if a coefficient $a_{t-1}$ of $x^{t-1}$ of a t-degree error locator polynomial is non-zero and if not transforming the polynomial into one in which $a_{t-1}\neq 0$;

B. determining if $\text{Tr}(a_{t-1})=1$, and if not transforming the polynomial into one which $\text{Tr}(a_{t-1})=1$, where $c_2(x)$ is the polynomial with $\text{Tr}(a_{t-1})=1$;

C. factoring the polynomial into $$g(x)=\gcd\left(S(x)=\sum_{i=0}^{m-1}x^{2^i}, c_2(x)\right) \text{ and }$$

$$h(x)=\gcd(S(x)+1, c_2(x));$$

D. determining roots of g(x) and h(x);

E. transforming the roots into the roots of the t-degree error locator polynomial; and F. determining which symbols in a code word are erroneous by associating the roots of the t-degree error locator polynomial with symbols in the code word.

2. The method of claim 1 further including the step of determining if the degrees of g(x) and h(x) are greater than a predetermined maximum and if so factoring either or both of g(x) and h(x) into factors with degrees that are less than or equal to the predetermined maximum.

3. The method of claim 1 wherein the step of factoring $c_2(x)$ includes i. determining a residue $R(x)\equiv S(x) \bmod c_2(x)$, ii. determining g(x) as the greatest common divisor of $c_2(x)$ and R(x), and iii. determining h(x) as $$\frac{c_2(x)}{g(x)}.$$

4. The method of claim 3 wherein the step of determining the residue includes the steps of:

a. for $$c_2(x)=x^t+c_{t-1}x^{t-1}+c_{t-2}x^{t-2}+\ldots+c_1 x+c_0,$$

defining $\theta(x)\equiv c_{t-1}x^{t-1}+c_{t-2}x^{t-2}+\ldots+c_1 x+c_0$ and $x^t\equiv\theta(x) \bmod c_2(x)$, b. calculating $x^{t+2} \bmod c_2(x)=x^2*x^t=x^2\theta(x) \bmod c_2(x)$ and iteratively calculating $x^{t+2k} \bmod c_2(x)$ for k=2, 3 . . . , 2(t−1) as $x^2$ multiplied by the polynomial $x^{t+(2k-1)} \bmod c_2(x)$, where an iteration produces a polynomial $\theta_{s_{t+2}} \ldots \theta_{s_{2(t-1)}}$ associated with $x^{t+2}, \ldots x^{2(t-1)}$ c. calculating $\theta_i(x)\equiv x^{2^i} \bmod c_2(x)$ for i=u,u+1, . . . m−1, as $$b_{i,t-1}x^{t-1}+b_{i,t-2}x^{t-2}\ldots+b_{i,1}x+b_{i,0}=b^2_{i-1,t-1}\theta_{s_{2(t-1)}}(x)+\ldots+b^2_{i-1,u}\theta_{s_t}(x)+b^2_{i-1,u-1}x^{2(u-1)}+\ldots+b^2_{i-1,1}x^2+b^2_{i-1,0}$$

where $u=\lceil \ln t \rceil$, b's are coefficients of a polynomial calculated in step b for $x^u$, and d.

$$R(x) = x^{2^0} + x^{2^1} + x^{2^2} + \ldots + x^{2^u} \sum_{i=3}^{m-1} \Theta_i(x).$$

5. A method for determining which symbols in a code word contain errors based on a degree-t error locator polynomial c(x) over $GF(2^m)$, with t odd and greater than or equal to five, the method including the steps of:

A. determining residues $R_i(x) \equiv S(\alpha^i x) \bmod c(x)$ for $i=0, 1, \ldots, m-1$ and selecting a residue with degree greater than or equal to one, where $$S(x) = \sum_{i=0}^{m-1} x^{2^i};$$

B. determining $g(x) = \gcd(c(x), R_i(x))$ and $$h(x) = \frac{c(x)}{g(x)};$$

C. determining roots of $g(x)$ and $h(x)$; and

D. determining which symbols in a code word are erroneous by associating the roots with symbols of the code word.

6. The method of claim 5 further including the step of determining if the degrees of $g(x)$ and $h(x)$ are greater than a predetermined maximum and if so factoring either or both of $g(x)$ and $h(x)$ into factors with degrees that are less than or equal to the predetermined maximum.

7. The method of claim 5 including in the step of determining residues the steps of:

a. for $$c_2(x) = x^t + c_{t-1}x^{t-1} + c_{t-2}x^{t-2} + \ldots + c_1 x + c_0,$$

defining $\theta(x) \equiv c_{t-1}x^{t-1} + c_{t-2}x^{t-2} + \ldots + c_1 x + c_0$ and $x^t \equiv \theta(x) \bmod c_2(x)$, b. calculating $x^{t+2} \bmod c_2(x) = x^2 * x^t = x^2 \theta(x) \bmod c_2(x)$ and iteratively calculating $x^{t+2k} \bmod c_2(x)$ for $k=2, 3 \ldots, 2(t-1)$ as $x^2$ multiplied by the polynomial $x^{t+(2k-1)} \bmod c_2(x)$, where an iteration produces a polynomial $\theta_{s_{t+2}}(x)$, $\theta_{s_{t+3}}(x) \ldots \theta_{s_{2(t-1)}}$ associated with $x^t, x^{t+2}, \ldots x^{2(t-1)}$ c. calculating $\theta_i(x) \equiv x^{2^i} \bmod c_2(x)$ for $i=u, u+1, \ldots m-1$, as $$b_{i,t-1}x^{t-1} + b_{i,t-2}x^{t-2} \ldots + b_{i,1}x + b_{i,0} = b^2_{i-1,t-1}\theta_{s_{2(t-1)}}(x) + \ldots + b^2_{i-1,u}\theta_{s_t}(x) + b^2_{i-1,u-1}x^{2(u-1)} + \ldots + b^2_{i-1,1}x^2 + b^2_{i-1,0}$$

where $u = \lceil \ln t \rceil$ and b's are coefficients of a polynomial calculated in step b for $x^u$, and d.

$$R_i(x) = \alpha^i x + \alpha^{2i} x^2 + \ldots + \alpha^{ui} x^u + \sum_{k=u}^{m-1} \sum_{j=0}^{t-1} \alpha^{2^k i} b_{k,j} x^j \equiv S(\alpha^i x) \bmod c(x).$$

8. The method of claim 5 including in the step of determining residues the steps of:

a. for $$c_2(x) = x^t + c_{t-1}x^{t-1} + c_{t-2}x^{t-2} + \ldots + c_1 x + c_0,$$

defining $\theta(x) \equiv c_{t-1}x^{t-1} + c_{t-2}x^{t-2} + \ldots + c_1 x + c_0$ and $x^t \equiv \theta(x) \bmod c_2(x)$, b. calculating $x^{t+2} \bmod c_2(x) = x^2 * x^t = x^2 \theta(x) \bmod c_2(x)$ and iteratively calculating $x^{t+2k} \bmod c_2(x)$ for $k=2, 3 \ldots, 2(t-1)$ as $x^2$ multiplied by the polynomial $x^{t(2k-1)} \bmod c_2(x)$, where an iteration produces a polynomial $\theta_{s_{t+2}}(x)$, $\theta_{s_{t+3}} \ldots \theta_{s_{t-1}}$ associated with $x^t, x^{t+2}, \ldots x^{2(t-1)}$ c. calculating $\theta_i(x) \equiv x^{2^i} \bmod c_2(x)$ for $i=u, u+1, \ldots m-1$, as $$b_{i,t-1}x^{t-1} + b_{i,t-2}x^{t-2} \ldots + b_{i,1}x + b_{i,0} = b^2_{i-1,t-1}\theta_{s_{2(t-1)}}(x) + b^2_{i-1,t-2}\theta_{s_t}(x) + \ldots +$$

$$b^2_{i-1,u}\theta(x) + b^2_{i-1,u-1}x^{2(u-1)} + \ldots + b^2_{i-1,1}x^2 + b^2_{i-1,0}$$

where $u = \lceil \ln t \rceil$ and b's are coefficients of a polynomial calculated in step b for $x^u$, and d. for $i=0$, determining:

$$R_{i,1} = \sum_{k=u}^{m-1} \alpha^{2^k i} b_{k,1} + \alpha^i$$

and if $R_{i,1}=1$, calculating the remaining coefficients of $R_i(x)$, or if $R_{i,1}=0$ setting $i=i+1$ and repeating for $i \leq m-1$.

* * * * *